(12) United States Patent
Vo et al.

(10) Patent No.: US 8,748,904 B2
(45) Date of Patent: Jun. 10, 2014

(54) LOW LOSS NANO-APERTURE

(71) Applicant: The Board of Trustees of the Leland Stanford Junior University, Palo Alto, CA (US)

(72) Inventors: Sonny Vo, Menlo Park, CA (US); James S. Harris, Jr., Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/758,829

(22) Filed: Feb. 4, 2013

(65) Prior Publication Data
US 2014/0042606 A1  Feb. 13, 2014

Related U.S. Application Data

(60) Provisional application No. 61/594,213, filed on Feb. 2, 2012.

(51) Int. Cl.
| H01L 27/15 | (2006.01) |
| H01L 29/26 | (2006.01) |
| H01L 31/12 | (2006.01) |
| H01L 33/00 | (2010.01) |
| H01L 33/22 | (2010.01) |

(52) U.S. Cl.
CPC ............ *H01L 33/007* (2013.01); *H01L 33/22* (2013.01)
USPC ............................................... 257/79; 257/85

(58) Field of Classification Search
CPC ............................. H01L 33/007; H01L 33/22
USPC ...................................... 257/79, 80, 81, 85
See application file for complete search history.

(56) References Cited

U.S. PATENT DOCUMENTS

| 4,713,260 | A | 12/1987 | Roberts et al. | |
| 6,110,277 | A * | 8/2000 | Braun | 117/94 |
| 6,657,237 | B2 * | 12/2003 | Kwak et al. | 257/99 |
| 7,196,357 | B2 * | 3/2007 | Narui et al. | 257/82 |
| 7,423,265 | B2 * | 9/2008 | Matteo et al. | 250/306 |
| 2011/0127554 | A1 * | 6/2011 | Lee et al. | 257/98 |

\* cited by examiner

*Primary Examiner* — Phat X Cao
(74) *Attorney, Agent, or Firm* — Lumen Patent Firm

(57) ABSTRACT

Low loss optical apertures are provided. A silicon intermediate layer sandwiched between a metal aperture layer and a dielectric layer has been found to offer a good combination of low optical loss combined with superior mechanical properties.

8 Claims, 10 Drawing Sheets

302

304

306

308

310

312

314

316

US 8,748,904 B2

LOW LOSS NANO-APERTURE

CROSS REFERENCE TO RELATED APPLICATIONS

This application claims the benefit of U.S. provisional patent application 61/594,213, filed on Feb. 2, 2012, entitled "Low Loss Nano-aperture", and hereby incorporated by reference in its entirety.

FIELD OF THE INVENTION

This invention relates to near-field optical sources.

BACKGROUND

Near field optical probes have been under investigation for some time. In such probes, a sub-wavelength aperture is employed to increase resolution compared to the conventional diffraction limit. More recently, vertical cavity surface emitting lasers (VCSELs) have been considered in connection with near-field optical probes. For example, in U.S. Pat. No. 7,095,767, enhanced near field brightness is provided with an aperture in the laser emission facet of a VCSEL.

However, we have found that known approaches for integrating an aperture with a VCSEL to provide a near field source suffer from significant disadvantages, and so it would be an advance in the art to alleviate these disadvantages.

SUMMARY

One significant disadvantage of conventional approaches for integrating VCSELS with near field apertures is that the resulting devices tend to have a basically planar configuration, with a sub-wavelength aperture laterally surrounded by a much larger emission face of the device. We have found that this configuration is not preferred in practice because near-field devices tend to have extremely small working distances (e.g., less than about 0.1 µm) between the device and the object being probed or otherwise interacting with the near-field device. Such small working distances can cause difficulty for near field probe devices having a planar configuration. For example, suppose the object being probed has lateral dimensions on the order of 10 µm, and that the VCSEL emission face of the near-field probe device has comparable lateral dimensions. Then parallelism to roughly 1% or better will be required in order to achieve a 0.1 µm working distance at the aperture without a collision between the object being probed and the near-field probe device. Such collisions are likely to damage the near-field probe device and/or the object being probed, and are therefore highly undesirable. As lateral dimensions increase, the required parallelism becomes more stringent, leading to greater practical difficulties. This problem of device geometry does not appear to have been appreciated in the prior art.

In this work, this geometric problem is alleviated by providing a support member having a base and a tip in a VCSEL near-field probe. The support member is substantially transparent (i.e., transmittance of 90% or more) at the emission wavelength(s) of the VCSEL. The base of the support member is disposed on the VCSEL such that radiation emitted from the VCSEL propagates toward the tip of the support member. A screen is disposed on the tip of the support member, where the screen is substantially opaque at the emission wavelength (i.e., transmittance of 5% or less), except at an aperture that is present in the screen. The aperture is a sub-wavelength aperture (i.e., it has a largest lateral dimension of half the emission wavelength or less).

Preferably, the support member has a shape that alleviates the above-described geometrical problem (e.g., a pyramid shape, a narrow cylindrical shape, etc.). With such a shape for the support member, the requirement for parallelism between the near-field probe device and the object being probed can be greatly reduced or even effectively eliminated. It is convenient to refer to such a device as a VCSEL nanoscope.

While investigating this geometry for a VCSEL near field device, we have found that it can be important to maximize the reflectance provided by the screen combined with the support member as seen by the VCSEL. In particular, aluminum was found to be a less-preferred material for the screen because its reflectance can be too low for this application. Aluminum is often used to make near-field apertures because such apertures usually have a thin metal layer supported on a dielectric layer, and aluminum tends to bond well to the dielectric layers that are commonly used in practice. Gold is a lower loss material than aluminum at many wavelengths of interest, but it has a tendency to bond poorly to the dielectric layers that are commonly used in practice. Conventional intermediate layers (e.g., a titanium intermediate layer) can be used to improve the adhesion of gold to the dielectric layer, but the resulting aperture structures still tend to have too much loss, because the titanium intermediate layer provides significant optical loss. This problem relating to aperture loss does not appear to be appreciated in the prior art.

We have alleviated this problem by using a silicon intermediate layer between the gold screen layer and the dielectric support layer. Calculations show significantly reduced loss for this configuration, and experiments show good adhesion of gold, combined with VCSEL lasing in situations where the aperture reflectance is important for achieving lasing. An example of such a case is when the top distributed Bragg reflector (DBR) of the VCSEL has relatively low reflectance.

Thus there are two aspects of the present inventions: 1) a support member to separate the aperture screen from the VCSEL emission face, and 2) a silicon intermediate layer to promote adhesion of a metal aperture layer on a dielectric layer. These aspects can be practiced independently or in combination.

DETAILED DESCRIPTION

Figure 1:
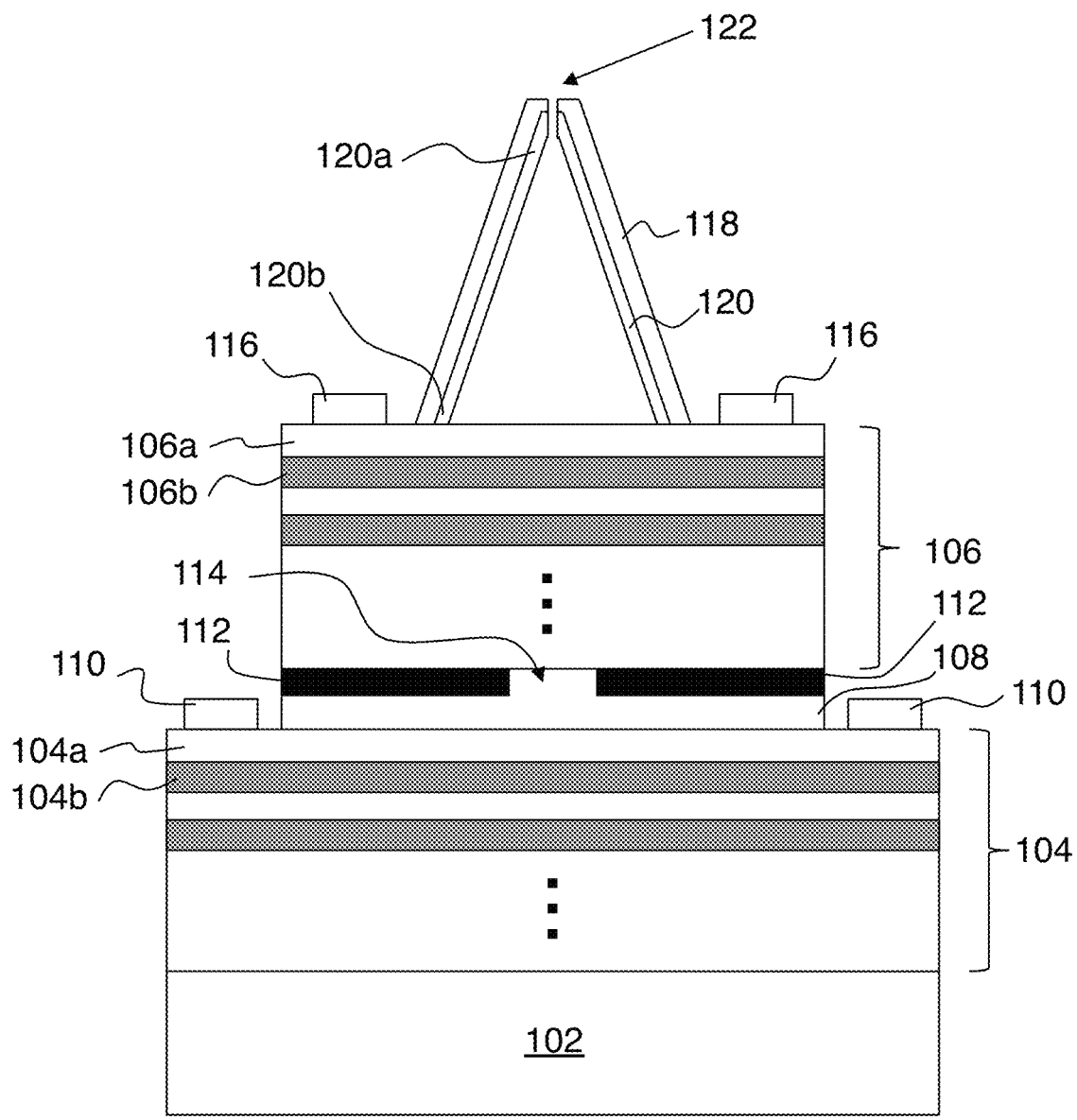
FIG. 1 shows an embodiment of the invention.

FIG. 1 shows an embodiment of the invention. In this example, a bottom DBR structure 104 is disposed on a substrate 102. DBR structure 104 can be made of alternating layers of high and low index materials to form a stack of layers. Two layers of this stack are referenced as 104a and 104b. A top DBR structure 106 is also present. DBR structure 106 can be made of alternating layers of high and low index materials to form a stack of layers. Two layers of this stack are referenced as 106a and 106b. A cavity layer 108 is sandwiched between the top and bottom DBR structures. Cavity layer 108 can include gain enhancing features (not shown) such as quantum wells, quantum wires etc., as is known in the art. In this example, oxide layer 112 with an aperture 114 in it provides lateral mode control for the VCSEL. Electrical contacts can be provided by bottom DBR contact 110 and top DBR contact 116. Alternatively, the bottom DBR contact could be made on the back side (i.e., on the bottom of substrate 102). In this example, the bottom DBR structure is preferably doped n-type, and the top DBR structure is preferably doped p-type. The doping of these structures can be the other way around.

Electrically the device is a diode, and when the diode is forward biased, optical emission from cavity layer 108 is reflected back and forth between the top and bottom DBR structures. If round trip gain exceeds round trip loss, the device lasers, leading to laser emission in the vertical direction on FIG. 1. The example of FIG. 1 is a top emitter, where laser emission is preferentially directed vertically upward (as opposed to downward). This can be arranged by making the reflectance of DBR structure 104 greater than the reflectance of DBR structure 106.

Support member 120 has a base 120b and a tip 120a. Radiation emitted from the VCSEL propagates toward tip 120a. A screen 122 is disposed on tip 120b. Screen 122 is substantially opaque at the emission wavelength, except at an aperture that is present in the screen. The aperture is a sub-wavelength aperture that has a largest lateral dimension of half the emission wavelength of the VCSEL or less. In this example, a metal layer 118 covers support member 120, and screen 122 is formed by patterning the part of metal layer 118 that is over tip 120a.

The VCSEL can emit at any optical wavelength (e.g., present designs can cover the range from 670 nm to 1550 nm). The VCSEL power output can be held stable at a set current within its operating range. Thus, the near-field spot intensity at the nano-aperture can be adjusted for different applications.

Figure 2:
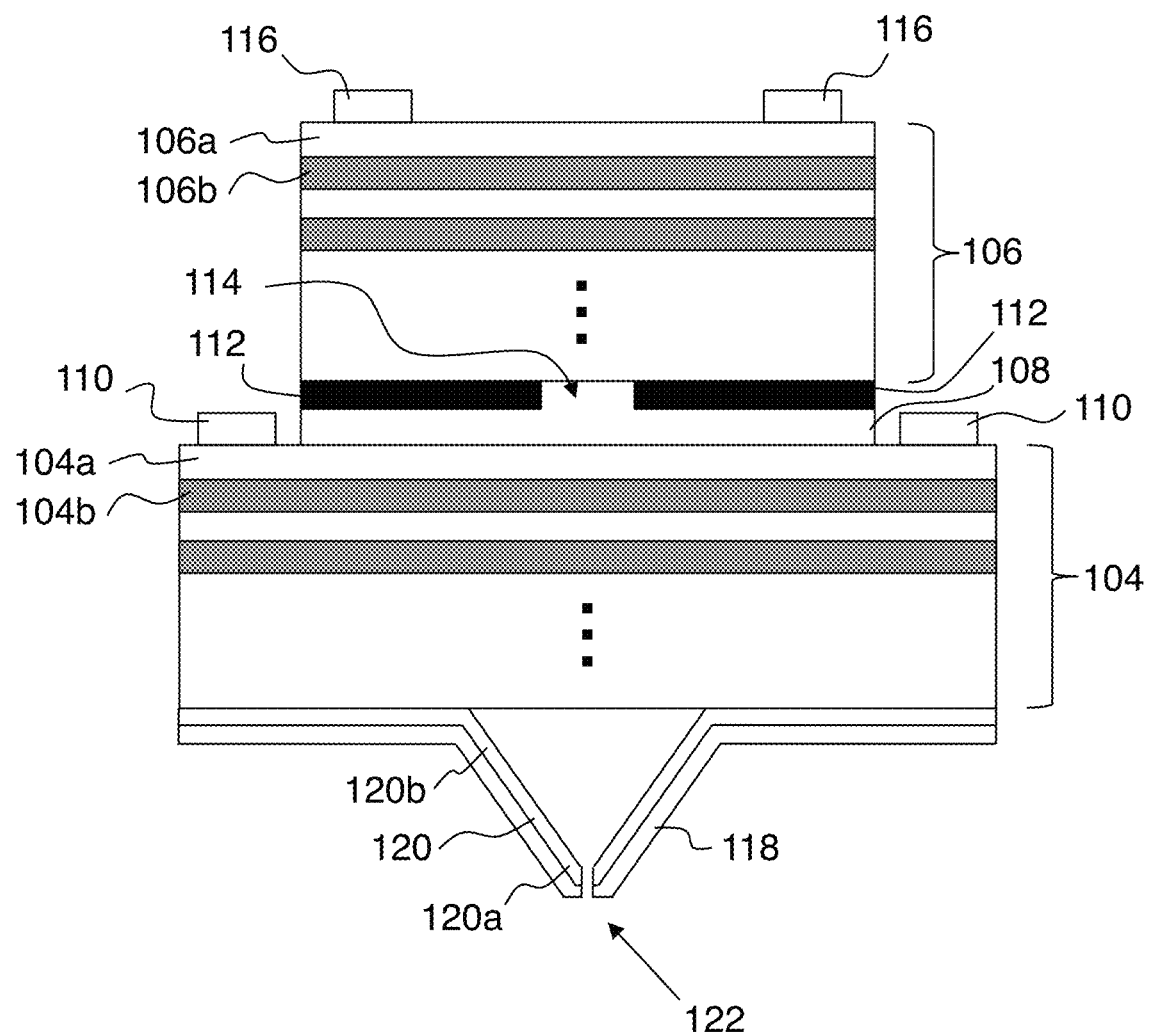
FIG. 2 shows another embodiment of the invention.

FIG. 2 shows an example that is similar to the example of FIG. 1, except that VCSEL emission is directed downward on the figure (i.e., the VCSEL of FIG. 2 is a bottom emitter). This can be arranged by making the reflectance of DBR structure 106 greater than the reflectance of DBR structure 104.

In some cases, the support member can be repeatedly attached and/or detached from the VCSEL. For example, a commercially available VCSEL can have the support member+aperture disposed on its emission face. If the aperture becomes damaged, or it is desired to change to a different aperture, the support member can be removed and replaced with a support member having a new (or different) aperture. This advantageously allows use of the same VCSEL with numerous apertures, which is highly desirable in view of the relatively high cost of the VCSEL, and the relative ease of damaging nano-scale apertures.

In the examples of FIGS. 1 and 2, the aperture is formed in a metal layer 118 disposed on support member 120 which is made of a dielectric material. Suitable materials for metal layer 118 include, but are not limited to: gold, silver, silver coated with titanium oxide, and aluminum. Suitable materials for support member 120 include, but are not limited to: silicon oxide, silicon nitride, and hafnium oxide.

As described in greater detail below, some embodiments are as shown on FIGS. 1 and 2, with the addition of a silicon intermediate layer between support member 120 and metal layer 118. If present, such a silicon intermediate layer preferably has a thickness between 2 nm and 4 nm.

Figure 3:
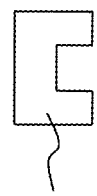
FIG. 3 shows several exemplary aperture shapes suitable for use with embodiments of the invention.
Figure 3:
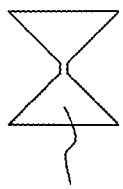
Figure 3:
Figure 3:
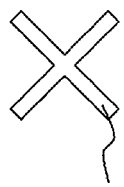
Figure 3:
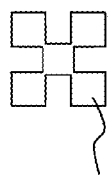
Figure 3:
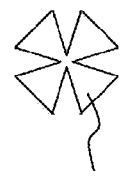
Figure 3:
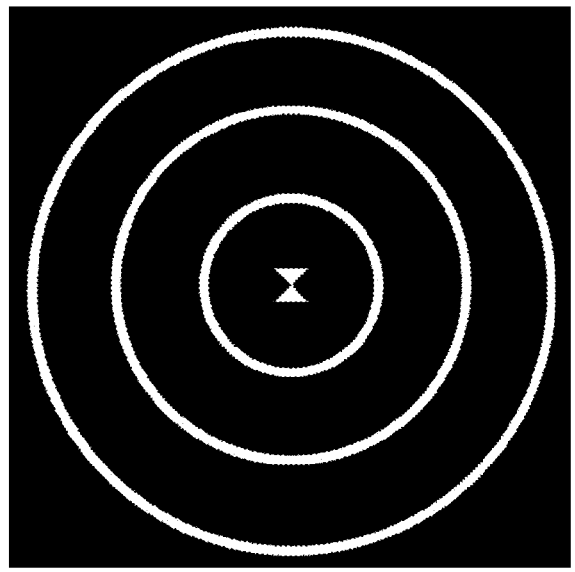
Figure 3:
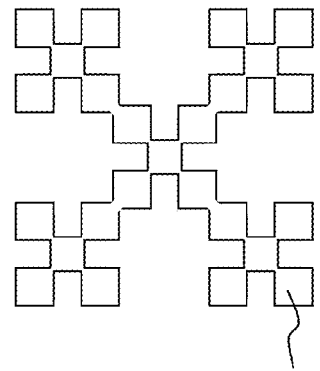

The aperture at the tip of the support member can have any shape. Preferably, the aperture shape is chosen to enhance near-field transmission. FIG. 3 shows several exemplary aperture shapes suitable for use with embodiments of the invention. Suitable aperture shapes include, but are not limited to: C-apertures (e.g., 302 on FIG. 3), bowtie apertures (e.g., 304 on FIG. 3), L-apertures (e.g., 306 on FIG. 3), quadrupolar apertures (e.g., 308, 310 and 312 on FIG. 3), bull's eye patterns (e.g., 314 on FIG. 3), fractal iterate apertures (e.g., 316 on FIG. 3), and arrays or combinations thereof. Different apertures have different near-field properties. The aperture shape can be selected to meet the requirements of particular applications. Further details relating to fractal iterate aperture shapes are given in U.S. Pat. No. 7,423, 265, hereby incorporated by reference in its entirety.

Figure 4A:
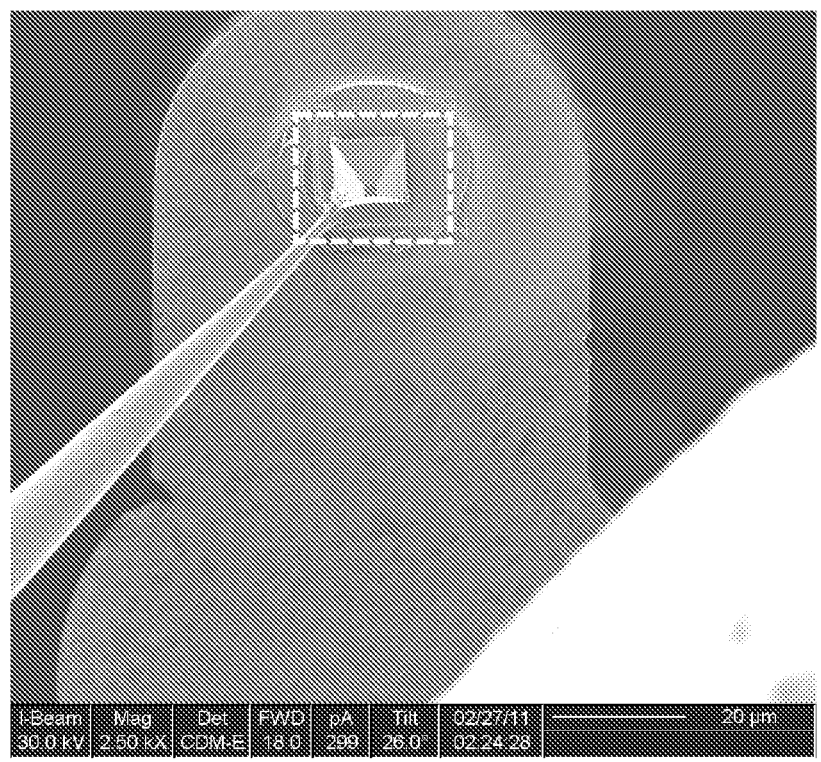
FIGS. 4A-B show scanning electron microscope (SEM) images of fabricated nano-aperture pyramids.
Figure 4B:
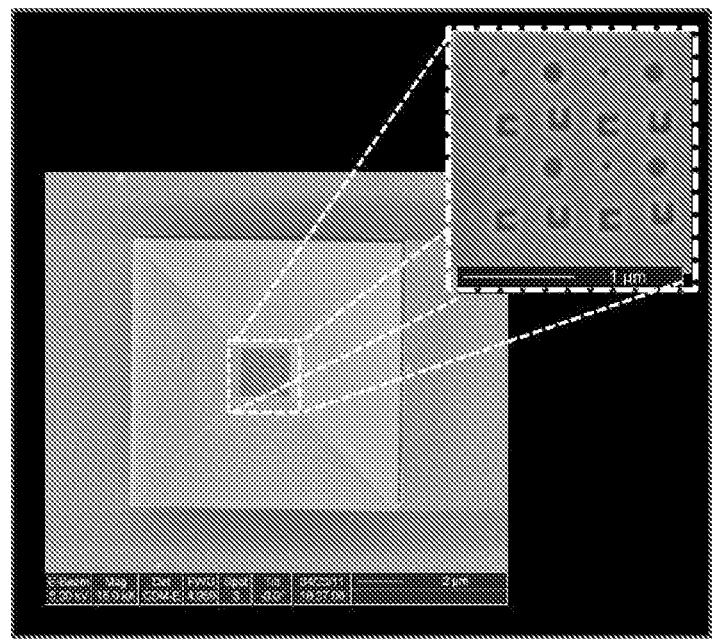

FIGS. 4A-B show scanning electron microscope (SEM) images of fabricated nano-aperture pyramids. The view of FIG. 4B is a close up view of the white dashed rectangle on FIG. 4A. The structure of this example was made by fabricating a 70 nm thick pyramidal shell of silicon nitride. After that, 3 nm of silicon followed by 150 nm of gold was deposited on the top surface. Apertures were fabricated in the tip by a through-the-membrane (TMM) process, where the focused ion beam is incident on the back side of the membrane (i.e., the side that will eventually face toward the VCSEL).

In one experiment, a SiNx cantilever was fabricated and coated with Si (3 nm) and Au (150 nm). A gallium-focused ion beam (FIB) was used to mill the nanoaperture on the backside of the SiNx cantilever (i.e., the side of the aperture that faces (or will face) the VCSEL source). We have found that FIB milling often causes aperture edges on the incident side of the ion beam to be slightly rounded. We have also found that such rounded aperture edges have a much greater detrimental effect on aperture performance if they are on the front side of the aperture than if they are on the back side of the aperture. Thus, backside FIB milling (i.e., ion beam incident on the back side of the aperture) is often preferred.

Direct milling on the pyramid (i.e., front side ion milling) is possible if a helium ion microscope is used or a latest generation gallium ion FIB. We have demonstrated nearly ideal apertures made directly on the front side of the pyramid by using the new helium ion microscope technology. Any shape of nanoaperture can be made with high definition. We have directly milled c-shapes, quadrupoles, and higher order fractal apertures. After fabrication of the aperture, it is attached to the VCSEL.

Figure 5:
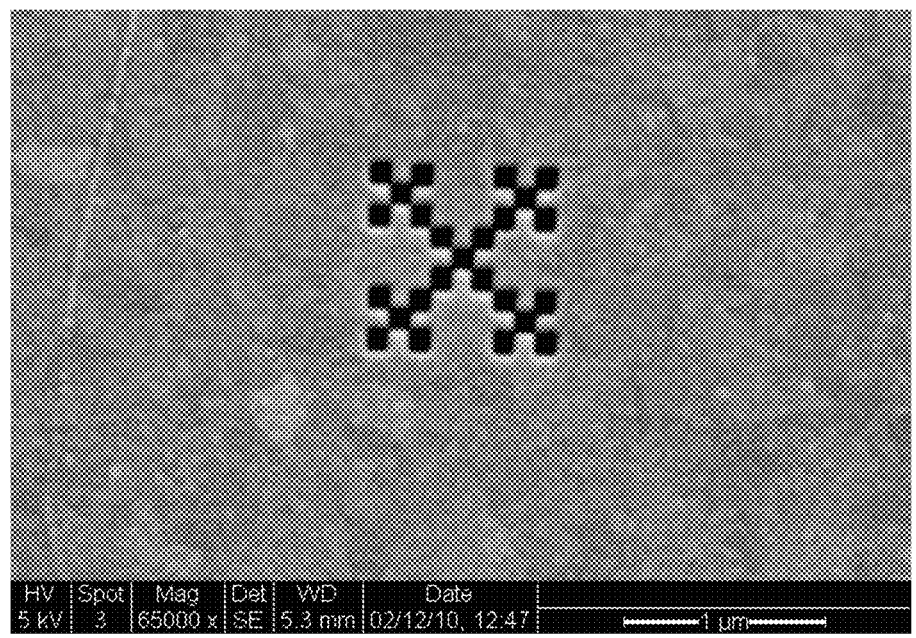
FIG. 5 shows an SEM image of a fabricated aperture.

FIG. 5 shows an SEM image of a fabricated aperture. This demonstrate the capability of fabricating complex aperture shapes.

Figure 6:
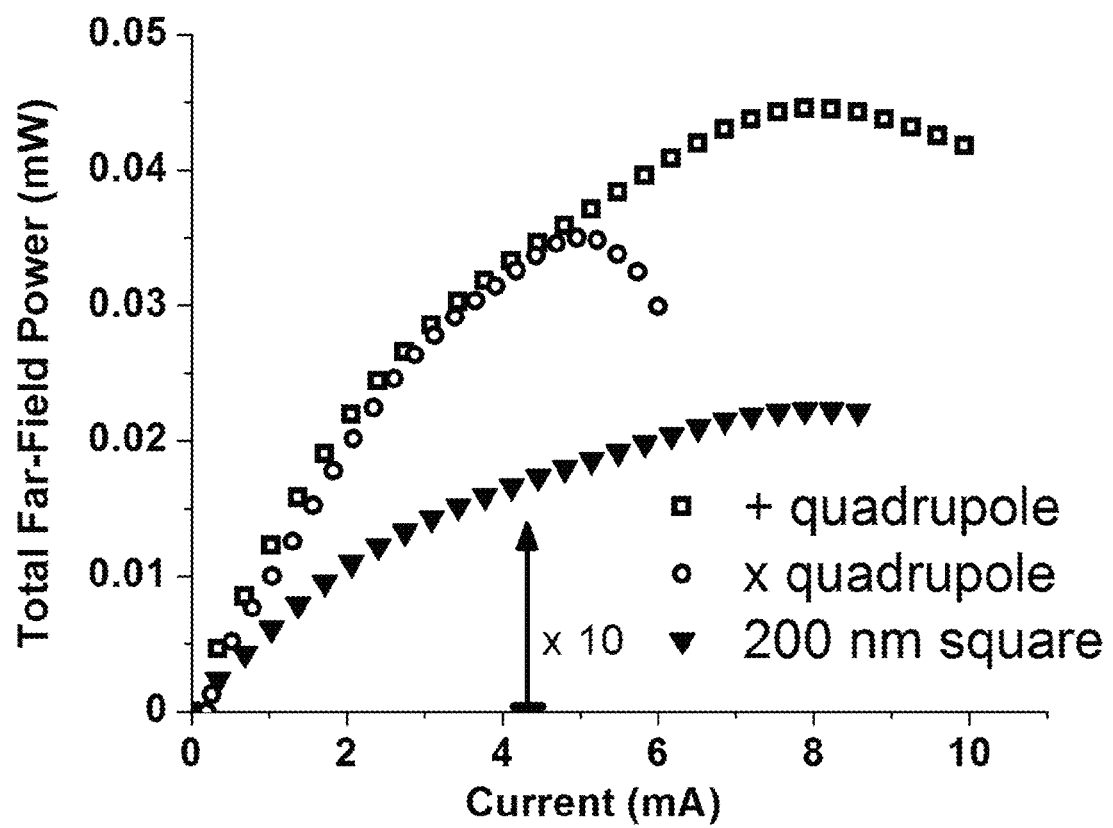
FIG. 6 shows measured power throughput for several aperture shapes combined with a VCSEL.

FIG. 6 shows measured power throughput for several aperture shapes combined with a VCSEL. In this experiment, the square aperture had twice the area of the quadrupole apertures tested, but had less than a tenth of the throughput of the quadrupole apertures. To facilitate comparison, the data points for the square aperture (i.e., the triangles) are multiplied by 10 on the plot of FIG. 6, and it is apparent that 10× the throughput of the square aperture is less than the throughput of the quadrupole apertures.

Figures 7A, 7B:
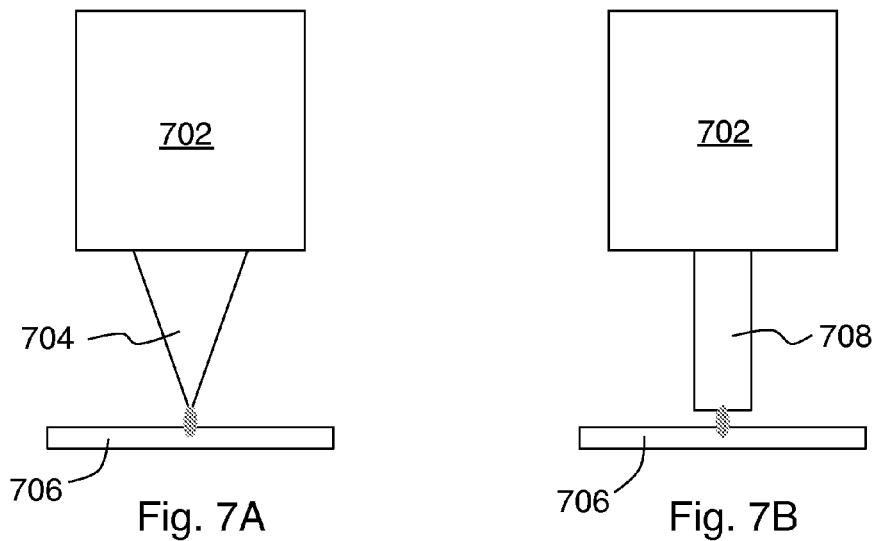
FIGS. 7A-B show exemplary embodiments of the invention suitable for use in connection with high density optical recording applications.

FIGS. 7A-B show exemplary embodiments of the invention suitable for use in connection with high density optical recording applications. Here a VCSEL 702 is combined with a support member 704 or 708 having an aperture (not shown) at its tip to provide a near-field spot (shaded area) to a recording medium 706 (e.g., medium 706 could be a phase change material). Here it is apparent that the support member can have various shapes. The specific examples shown on FIGS. 7A-B are pyramid shape (704 on FIG. 7A) and cylindrical shape (708 on FIG. 7B). Here a "pyramid" is defined as any shape having a base larger than its tip, where the side walls taper from the base to the tip. Pyramids can have three or more side walls. A cylinder is defined as any shape having a substantially constant lateral cross section shape relative to a longitudinal cylinder axis. This cross section shape can be circular, elliptical, square, rectangular, etc.

The preceding description of support member shape refers to the configuration of the outer surface of the support member. In general, support members having any shape can be either hollow or solid. Hollow support members (e.g., as shown on FIGS. 1 and 2) are often preferred because it is usually easier to fabricate an aperture in a thin membrane than in the tip of a solid object.

The density of conventional optical storage devices such as compact disk (CD) and digital video disk (DVD) is limited by the diffraction limit. Near-field optical storage provides a promising solution to bypass this limit. By applying sub-wavelength nano-apertures onto metal-coated pyramidal structure which is bonded on top of an integrated laser source (VCSEL), we can obtain a near-field spot size mainly determined by the size of the apertures, which can be far smaller than the wavelength. VCSELs are preferred over edge emitting lasers in this application, due to the advantages such as low cost on wafer testing, easy mass production, and 2D array scalability. Additionally, the surface mounted lasers can be affixed to gliders that provide accurate distance control between the laser and the optical recording surface.

Unconventional apertures, such as a C-shaped aperture, can have 1000 times higher transmission efficiency than a conventional square or circular aperture producing the same near-field spot size. These C-shaped apertures can be transferred via focused ion beam milling onto a metal coated, silicon nitride pyramid. The pyramid is then placed on top of the VCSEL. Simulations show output intensity sufficient for optical recording and a near-field spot size as small as one tenth of the wavelength are achievable.

The VCSEL nanoscope can realize and potentially revolutionize numerous near-field applications. For example, based on a 980 nm VCSEL, we should be able to realize a near-field spot size of about 100 nm, which will increase the storage capacity of a DVD medium to about 250 GB of storage, 50 times as that in a conventional DVD system. A 30 nm spot can be possible by decreasing the wavelength and tuning the aperture size, enabling 1 TB of data storage on a single DVD size disk. Besides optical data storage, the nano-aperture VCSEL can also be applied as an integrated light source for future nanophotonic circuits.

Figure 8:
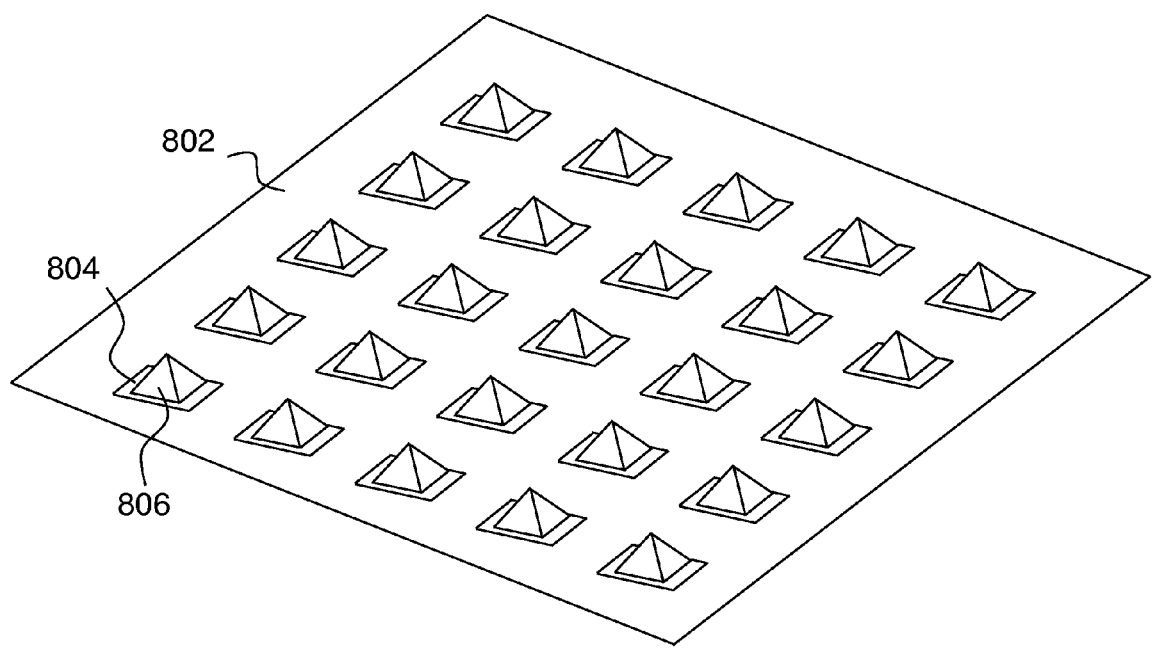
FIG. 8 shows an example of an array of VCSEL nanoapertures according to an embodiment of the invention.

FIG. 8 shows an example of an array of VCSEL nanaoapertures according to an embodiment of the invention. Here multiple VCSELs (one of which is referenced as 804), each having a nano-aperture in a corresponding support member (one of which is referenced as 806), are all disposed on a common substrate 802. Such embodiments may be useful for large scale applications of near-field optical probing.

In addition to providing a foundation for a number of system level demonstrations for optical storage, the VCSEL nanoscope can be an enabling technology for monolithic integration in nanophotonic circuits. Since the major advantage of VCSELs is its 2-D array scalability, vast arrays of the nano-scope can be constructed as illustrated in FIG. 8. This array device can be an essential component of important future instrumentations such as electron beam lithography system. Incorporating this VCSEL array in e-beam lithography can enable parallel writing at unprecedented speeds. Perhaps more significantly, in fundamental biology research, the nanoscope can be used to probe single molecule fluorescence or manipulate a single molecule via the principle of optical trapping.

The VCSEL nanoscope array as illustrated in FIG. 8 can significantly impact the field of ultra-resolution microscopy. The near-field light spot of about 50 nm in diameter can locally photo-activate a single molecule. The spot intensity can be tuned within the VCSEL operating range anywhere from a few mW/$\mu m^2$ up to 50 mW/$\mu m^2$. Moreover, 2-D arrays of VCSEL nanoscopes can be placed on a piezo-electric stage which can be translated in the x-y-z dimension with nanometer precision. Thus, 3-dimensional image re-construction can be achieved. Another unique feature of the VCSEL nanoscope array is that each element of the array can be independently and deterministically controlled. So for applications where large fluorescent molecules are present, the nanoscope can selectively excite different regions of the array to separate the fluorescent timing.

A compact, fully integrated instrument to image live cells beyond the diffraction limit of confocal microscopy can have a large impact in the field of biology. An immediate application important for human health would be imaging and studying the membrane structure of a cell, since agents such as cancer proteins localize themselves on the membrane. The near-field VCSEL nanoscope can potentially obtain a supra-resolution image of the surface topology of the cell membrane, and hence, can contribute to an enhanced understanding of the basic cellular functions important to human health.

Figure 9A:
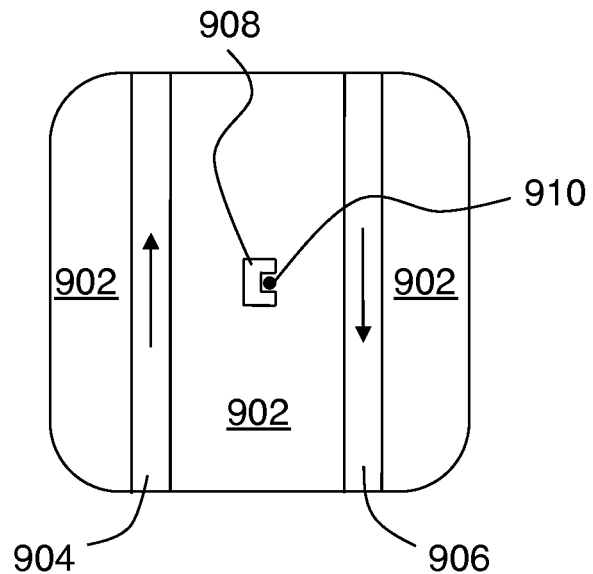
FIGS. 9A-B show top and side views of an optical recording head suitable for use with embodiments of the invention.
Figure 9B:
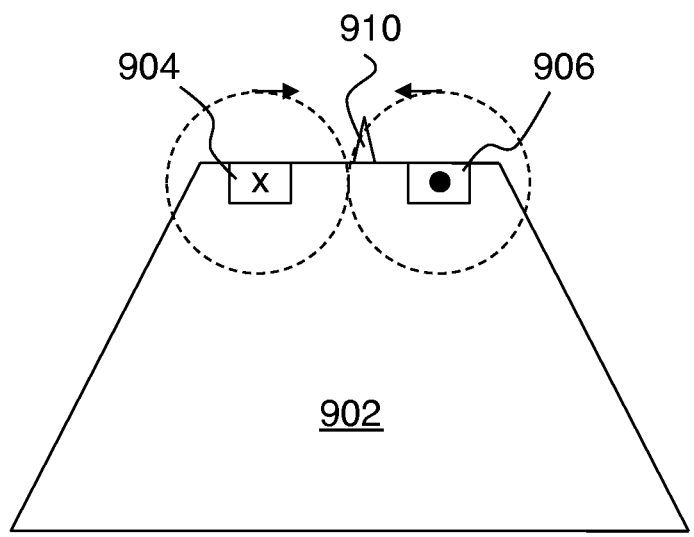

FIGS. 9A-B show top and side views of an optical recording head suitable for use with embodiments of the invention. More specifically, FIG. 9A shows a top view of a support member 902 including an aperture 908 and an aperture tip 910. FIG. 9B shows a corresponding side view. In the top surface of support member 902, current strips 904 and 906 are embedded. Current carried by the current strips can cause magnetic fields in the location of the aperture (as shown by dashed lines on FIG. 9B), thereby enhancing resonant transmission properties of aperture 908. Aperture tip 910 can also enhance resonant transmission properties of aperture 908. This structure, combined with a VCSEL, may be suitable for use as a read-write head for high-density optical recording.

Figure 10:
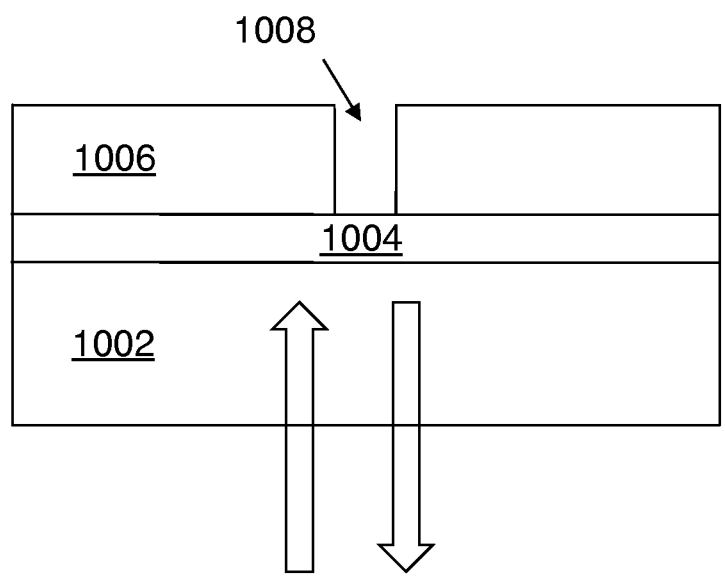
FIG. 10 schematically shows an aperture structure having an intermediate layer between metal and dielectric.

As indicated above, the use of a silicon intermediate layer has been found to be generally useful for improving metal adhesion to a dielectric in connection with optical apertures. FIG. 10 schematically shows an aperture structure having an intermediate layer between the metal and the dielectric. Here silicon intermediate layer 1004 is sandwiched between metal layer 1006 and dielectric layer 1002. Metal layer 1006 includes an aperture 1008. The aperture extends through at least the metal layer. Aperture 1008 can also extend through silicon layer 1004, or through both layers 1002 and 1004. Light propagation paths in a reflection geometry are shown with block arrows. Since Silicon is transparent in the infrared, this intermediate layer need not introduce significant optical loss. The benefit of using Au as opposed to Al is increased reflectivity (i.e., reduced optical loss), which is especially helpful in connection with integration with a VCSEL, where reducing optical loss is highly important.

Figure 11A:
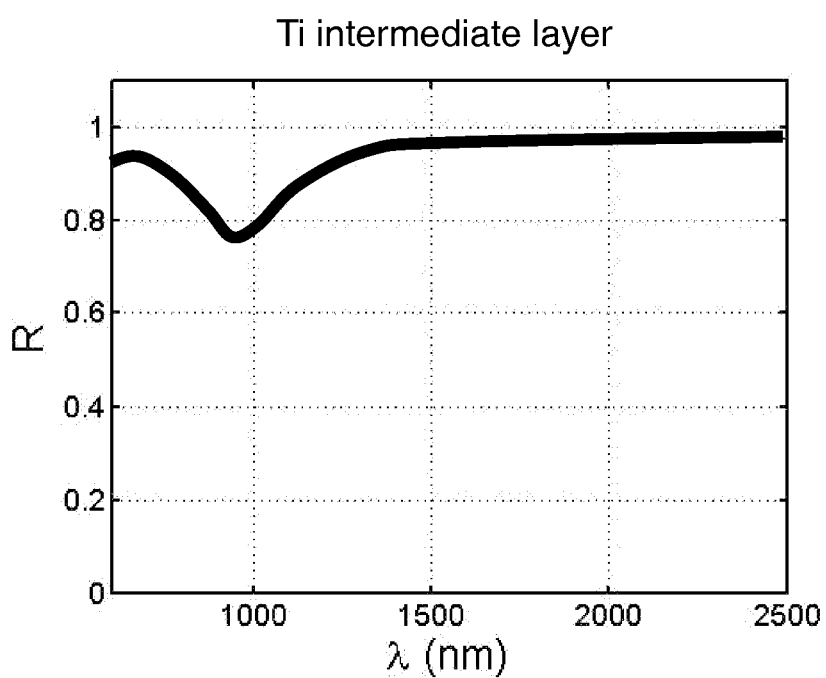
FIG. 11A shows calculated reflectance for a $SiO_2$/Ti/Au structure.
Figure 11B:
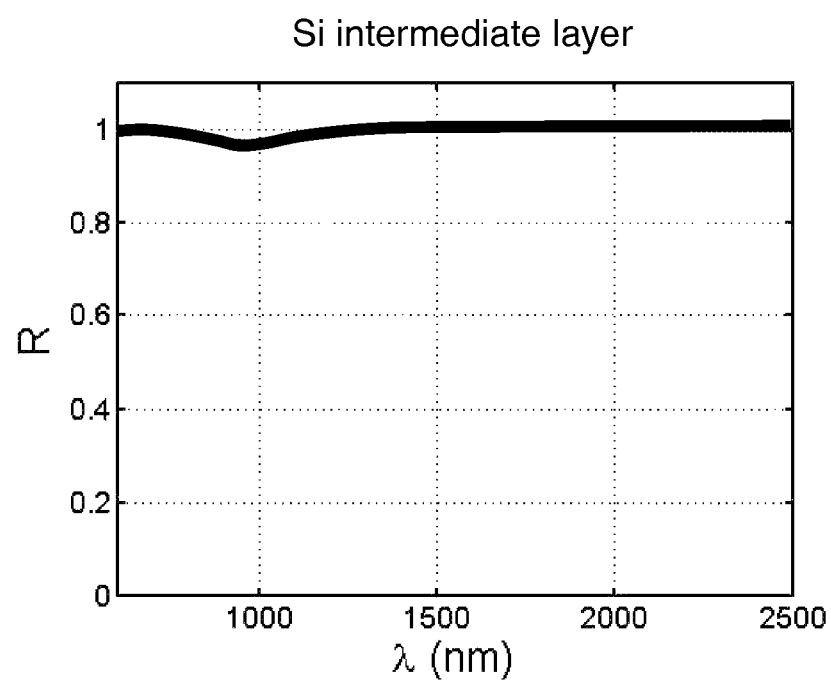
FIG. 11B shows calculated reflectance for a SiO$_2$/Si/Au structure.

FIG. 11A shows calculated reflectance for a $SiO_2$/Ti/Au structure. FIG. 11B shows calculated reflectance for a $SiO_2$/Si/Au structure. From these results, it is apparent that the conventional titanium intermediate layer has significantly higher optical loss than a silicon intermediate layer. Preferably, the thickness of the silicon intermediate layer is from 2 nm to 4 nm. Suitable materials for metal layer 1008 include, but are not limited to: gold, silver, silver coated with titanium oxide, and aluminum. Suitable materials for dielectric layer 1002 include, but are not limited to: silicon oxide, silicon nitride, and hafnium oxide. High K dielectrics (i.e., dielectric constant greater than 10) can also be employed for dielectric layer 1002.

Experimental results are given in the following table. Here a five point scale is used for qualitative mechanical results, with 0 being poorest and 5 being best. All apertures start with a silicon oxide layer and then have additional layers as in the material column below.

Here it is seen that the silicon intermediate layer has the best mechanical properties of all samples that were capable of lasing. A few nm of silicon can promote nucleation of metals onto a dielectric surface, thereby increasing film uniformity and improving adhesion. This has been implemented for nano-aperture VCSELs as described above. Metal grain sizes of <20 nm have been observed, as has exceptionally smooth surface morphology from SEM imaging.

| Material | Mechanical exfoliation | Scratch test | Lases |
| --- | --- | --- | --- |
| 5 nm Ti/150 nm Au | | | no |
| 1 nm Ge/120 nm Au | 2 | 1 | yes |
| 20 nm Al/120 nm Au | 4 | 3 | yes |
| 20 nm Al/2 nm Ti/120 nm Au | 0 | 0 | yes |
| 40 nm Au/6 nm Ge/120 nm Au | 0 | 2 | yes |
| 5 nm Si/120 nm Au | 5 | 5 | yes |

The invention claimed is:

1. Apparatus comprising:
    a silicon intermediate layer sandwiched between a dielectric layer and a metal layer;
    wherein the metal layer includes an optical aperture;
    wherein a thickness of the silicon intermediate layer is between 2 nm and 4 nm.

2. The device of claim 1, wherein the metal layer comprises gold.

3. The device of claim 1, wherein the metal layer comprises silver.

4. The device of claim 1, wherein the metal layer comprises silver coated with titanium oxide.

5. The device of claim 1, wherein the metal layer comprises aluminum.

6. The device of claim 1, wherein the dielectric layer comprises silicon oxide.

7. The device of claim 1, wherein the dielectric layer comprises silicon nitride.

8. The device of claim 1, wherein the dielectric layer comprises hafnium oxide.

* * * * *